(12) United States Patent
Lytle

(10) Patent No.: US 6,989,602 B1
(45) Date of Patent: Jan. 24, 2006

(54) DUAL DAMASCENE PROCESS WITH NO PASSING METAL FEATURES

(75) Inventor: Steven A. Lytle, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 530 days.

(21) Appl. No.: 09/667,046

(22) Filed: Sep. 21, 2000

(51) Int. Cl.
*H01L 23/48* (2006.01)
*H01L 23/52* (2006.01)

(52) U.S. Cl. ............... 257/773; 257/758; 257/762; 257/774

(58) Field of Classification Search ............ 257/752, 257/758, 760, 762, 773, 774; 438/618, 622, 438/626, 629, 631, 637, 639, 640
See application file for complete search history.

(56) References Cited

U.S. PATENT DOCUMENTS

| | | | |
|---|---|---|---|
| 5,654,589 A | | 8/1997 | Huang et al. |
| 5,827,776 A | * | 10/1998 | Bandyopadhyay et al. . 438/624 |
| 5,834,845 A | * | 11/1998 | Stolmeijer ................... 257/752 |
| 6,020,255 A | | 2/2000 | Tsai et al. |
| 6,127,260 A | * | 10/2000 | Huang ......................... 438/629 |
| 6,163,067 A | * | 12/2000 | Inohara et al. .............. 257/635 |
| 6,177,340 B1 | * | 1/2001 | Yoo et al. ................... 438/637 |
| 6,225,207 B1 | * | 5/2001 | Parikh ......................... 438/622 |

* cited by examiner

*Primary Examiner*—Hung Vu

(57) ABSTRACT

The present invention provides a method of forming integrated circuit interconnect structures wherein a passing metal feature does not include a landing pad. In an exemplary embodiment, the method includes forming a via opening through first and second dielectric layers, such as silicon dioxide layer, located over a conductive layer, such as copper, and to a first etch stop layer, such as silicon nitride, located over the conductive layer. A trench opening is then formed through the second dielectric layer and to a second etch stop layer. Once the via and trench openings are formed, an etch is conducted that etches through the first etch stop layer such that the opening contacts the underlying conductive layer.

2 Claims, 4 Drawing Sheets

DUAL DAMASCENE PROCESS WITH NO PASSING METAL FEATURES

TECHNICAL FIELD OF THE INVENTION

The present invention is directed, in general, to a semiconductor device and, more specifically, to an interconnect structure employing a dual damascene process with no passing metal features.

BACKGROUND OF THE INVENTION

Semiconductor devices, especially those that pertain to computer and telecommunications applications, have continued to be a focus for enhancing performance. Both smaller device size and higher speed of operation are performance targets. The success of many technology areas is dependent on the availability of high quality and cost effective integrated circuits. Transistors have been continually reduced in size as the ability to construct smaller gate structures has improved. As the size of transistors has decreased, the size of other components has become a limiting factor in increasing overall component densities.

Semiconductor devices employ a large number of openings in their design and manufacture. The size of these openings has been decreasing due to the demand for higher device packing densities and therefore smaller device size. As the size of the openings decreases, the need increases for tighter control to assure proper device operation and therefore overall quality. Some of these openings are typically used to provide electrical contacts.

A key area controlling the overall quality and reliability of semiconductor devices is the area of interconnections between the various integrated components and circuits of the device. As is well known, vias are metal filled openings between the various layers of a semiconductor device that provide electrical connection between the layers at appropriate points. Trenches contain metal runners that are positioned in a layer to electrically interconnect appropriate points in the layer including vias. As the size of the openings decrease, accurate positioning of the holes for vias and the trenches for runners are more difficult to construct.

Current construction techniques for stacked vias typically use a small "landing pad" to assure that appropriate connections are aligned and made from layer to layer. The landing pads are larger than the diameter of the via holes to allow for some degree of misalignment and still accomplish a reliable electrical connection. Metal runners may be narrower in width than the landing pads. Thus, if the trench areas are exposed correctly in the photolithography process, the landing pad areas tend to be underexposed. In contrast, if the landing pad areas are exposed correctly, the trench areas are usually overexposed. However, even if the landing pads and the trenches are the same width, the landing pads may be underexposed because generally they are much shorter. This disparate exposure effect creates the possibility of shorts across the landing pads and the runners.

To obviate the affects attributable to this disparate exposure effect, the industry has moved to biasing the reticle (photolithography mask), commonly using what is termed an optical proximity correction (OPC) technique. By biasing the landing pad features larger on the reticle, the exposure required for proper sizing of the trenches allows the landing pad areas to receive adequate exposure for the size needed, while at the same time adequately exposing the runner or trench areas. This solution, however, requires that spacing on the reticle be increased between openings and the runners or trenches, usually by a fixed margin or amount. As overall semiconductor device component size requirements continue to shrink, this fixed margin tends to become a limiting factor to minimizing component spacings.

Accordingly, what is needed in the art is a way to enhance the alignment process associated with the construction of vias and trenches without sacrificing critical space on the semiconductor wafer.

SUMMARY OF THE INVENTION

To address the above-discussed deficiencies of the prior art, the present invention provides a method of forming integrated circuit interconnect structures. In an exemplary embodiment, the method includes forming a via opening through first and second dielectric layers, such as silicon dioxide layers, located over a conductive layer, such as copper, and to a first etch stop layer, such as silicon nitride, located over the conductive layer. A trench opening is then formed through the second dielectric layer and to a second etch stop layer. In certain embodiments, the trench opening may be formed adjacent the via opening. Once the via and trench openings are formed, an etch is conducted that etches through the first etch stop layer such that the via opening contacts the underlying conductive layer.

Because the full via opening is etched before the formation of the trench, the photolithographic problems associated with the prior art methods are avoided. In fact, the design rules that require the trench to be a certain distance from the via can decreased because the over exposure or under exposure problems are substantially reduced, if not eliminated entirely.

In another embodiment, the via opening is a first via opening and forming the first via opening includes forming a second via opening through the first and second dielectric layers and to the first etch stop layer. In another aspect of this particular embodiment, the trench is a first trench and forming a trench opening includes forming a second trench over the second via opening. The second via opening, in advantageous embodiments, will ultimately become an interconnect structure formed by a single or dual damascene process. The present invention is particularly advantageous when conducted with damascene processes. In yet another aspect of this particular embodiment, etching includes etching through the second etch stop in the first and second trench openings to the first dielectric layer.

In another advantageous embodiment, forming a trench includes depositing a photoresist over the second dielectric layer and in the via opening and forming an opening in the photoresist through which the trench opening is formed.

Another embodiment also includes forming the conductive layer, forming a first etch stop layer comprising silicon nitride over the copper, forming a first dielectric layer over the first etch stop layer, forming a second etch stop layer comprising silicon nitride over the first dielectric layer, and forming a second dielectric layer over the second etch stop layer, all prior to forming the via opening.

Once the various openings are formed, a conductive material, such as copper, may be deposited within the openings. Preferably, the conductive material is then planarized back to the second dielectric to form a substantially planar surface on which subsequent layers may be formed.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry the various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
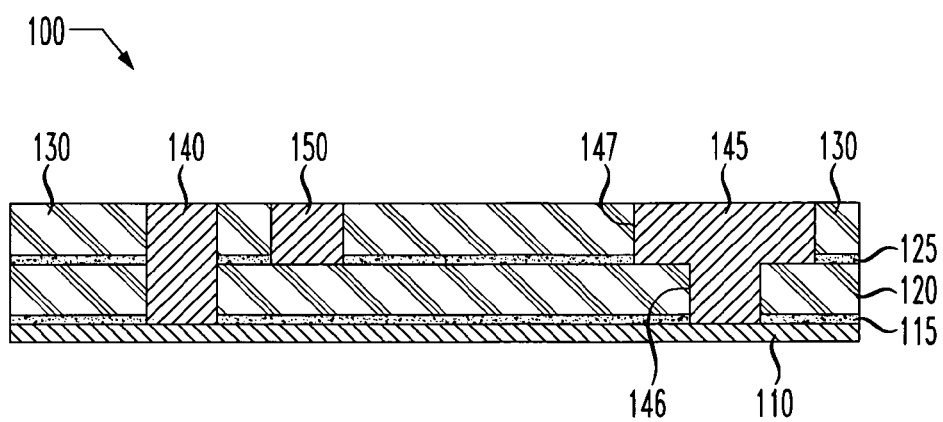
FIG. 1 illustrates a partial sectional view of an exemplary embodiment of an interconnect structure formed in accordance with the principals of the present invention.

Referring initially to FIG. 1, illustrated is a partial sectional view of an exemplary embodiment of an interconnect structure 100 formed in accordance with the principals of the present invention. The interconnect structure 100 includes a first metal feature 110 located on a surface of a semiconductor device, first and second etch stop layers 115, 125, first and second dielectric layers 120, 130. The interconnect structure 100 also includes a first via 140 that has a first portion that extends from the conductive layer 110 to the second etch stop layer 125 and a second portion that extends from the second etch stop layer 125 through the second dielectric layer 130. It should be noted that the via 140 does not have a landing pad, which may also be known as a passing metal feature, associated with it. In many conventional devices the landing pad is a metal-filled trench that is located immediately over a via and serves as a connection point for an overlying via. In such conventional devices, the trench portion is typically substantially wider than the lower via portion. The embodiment illustrated in FIG. 1 further includes a first trench 150 approximate the first via 140 and a combined via/trench 145 having a second via 146 and a second trench 147. In an exemplary embodiment, the combined via/trench 145 may be a damascene structure. In the illustrated embodiment, the interconnect structure 100 may be formed employing a method of the present invention further described in FIGS. 2–7. The methods covered by the present invention that can be used to fabricate such a structure offer advantages over the prior art devices. For example, the first via 140 that passes through the first and second dielectric layer 120, 130 can be formed in a way to avoid the formation of a landing pad over the portion of the first via that extends under the second etch stop layer 125. Because the present invention provides a device that does not require a landing pad to join vias, the overexposure or underexposure problems associated with prior art methods can be avoided.

Figure 2:
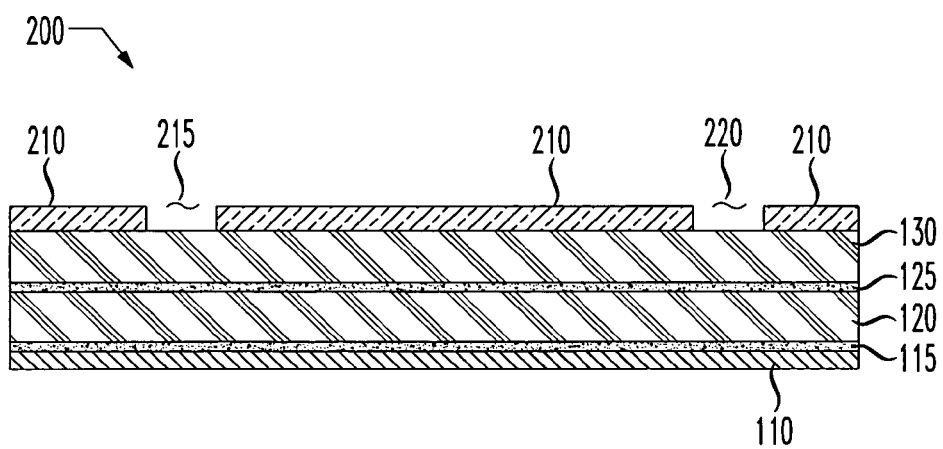
FIG. 2 illustrates a partial sectional view of an interconnect structure formed at an intermediate stage of manufacture of the interconnect structure of FIG. 1.

Turning now to FIG. 2, illustrated is a partial sectional view of an interconnect structure 200 formed at an intermediate stage of manufacture of the interconnect structure 100 of FIG. 1. The interconnect structure 200 includes the first metal feature 110, first and second etch stop layers 115, 125, first and second dielectric layers 120, 130 and a photoresist layer 210, all of which are deposited with conventional deposition processes and materials. The photoresist layer 210 is patterned for first and second via openings 215, 220 prior to the formation of any trenches.

In the illustrated embodiment, the first metal feature 110 is first formed by conventionally depositing a conductive layer of metal, such as copper. While the first metal feature 110 is shown as a continuous layer, it should be understood that this is for illustrative purposes only and that the first metal feature 110 will typically be patterned into multiple separate features. The first etch stop layer 115 is then conventionally formed over the conductive layer 110. Silicon nitride or other similar etch stop materials may be used. The first dielectric layer 120, which is typically silicon dioxide is then conventionally formed over the first etch stop layer 115. The second etch stop layer 125 is conventionally formed, also using silicon nitride, over the first dielectric layer 120. The second dielectric layer 130, which may also be comprised of silicon dioxide, is then formed over the second etch stop layer 125. Finally, the photoresist layer 210 is conventionally formed and patterned over the second dielectric layer 130 and patterned to locate the first and second via openings 215, 220.

The first and second dielectric layers 120, 130 may typically be formed through methods that include but are not limited to chemical vapor deposition, physical vapor deposition, such as high density plasma deposition processes, or a conventional spin on technique, to a thickness ranging from about 300 nm to about 1000 nm. The first and second etch stop layers 115, 125 may typically be deposited to a thickness ranging from about 15 nm to about 100 nm, by a conventional plasma enhanced chemical vapor deposition or other similar process.

The first metal feature 110, first and second etch stop layers 115, 125, and first and second dielectric layers 120, 130, are not limited to the materials disclosed above. For instance, the first metal feature 110 may include other appropriate conductor metals used in integrated circuit design as other applications or embodiments may require. Additionally, the first and second dielectric layers 120, 130 may also be formed from other appropriate dielectric materials. Alternatively, the first etch stop layer 115, located over the first metal feature 110, and the second etch stop layer 125 located over the first dielectric layer 120 may be formed from other available or future developed dielectric materials as well.

Figure 3:
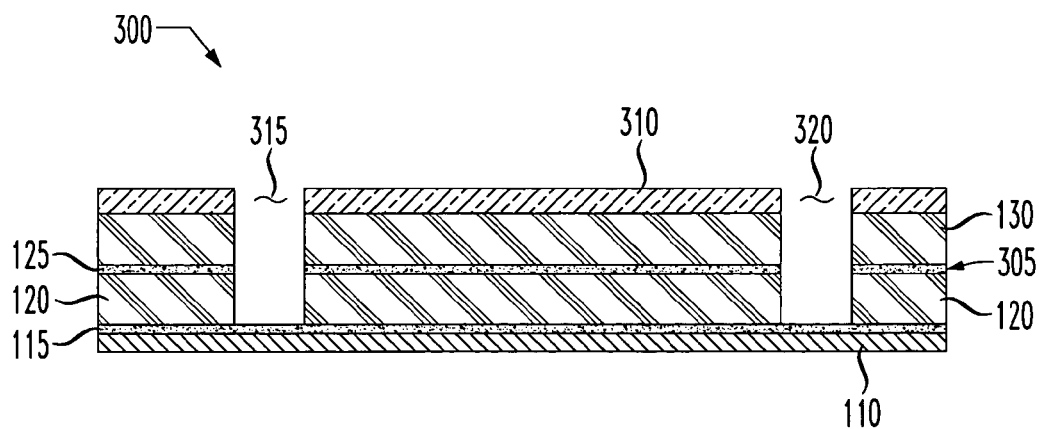
FIG. 3 illustrates a partial sectional view of an interconnect structure showing formation of via openings in the interconnect structure of FIG. 2.

Turning now to FIG. 3, illustrated is a partial sectional view of an interconnect structure 300 showing formation of via openings 315, 320 in the interconnect structure 200 of FIG. 2. During this particular step, the via openings 315, 320 are formed down to the first etch stop layer 115. The first and second dielectric layers 120, 130 form an interface 305, which can include the second etch stop layer 125 in those embodiments where the second etch stop layer 125 is present. However in other embodiments as illustrated below, the interface may simply be the plane at which the first and second dielectric layers 120, 130 contact each other. In the illustrated embodiment, it should be noted that the first and second via openings 315, 320 are formed through the first and second dielectric layers 120, 130, without first forming a landing pad at the interface 305. Thus, a landing pad located between the dielectric layers 120, 130 is not necessary. In other words, a landing pad formed in or on the upper surface of the first dielectric layer 120 is not necessary. The via openings 315, 320 are initially formed down to the first etch stop layer 115. The first and second dielectric layers 120, 130 are etched using a conventional dielectric etching process and the second etch stop layer 125 is also etched using conventional processes, such as by using a hexafluoride ($SF_6$) etch. Thus, if so desired, the first via 315 can be used as a pass through metal feature but because the via extends continuously through the first and second dielectric layer 120, 130, it is not necessary to form a landing pad trench between the portion of via 315 that extends under the second etch stop layer 125 and that portion of via 320 that extends above the second etch stop layer 125, as is conventionally done in prior art methods.

Figure 4:
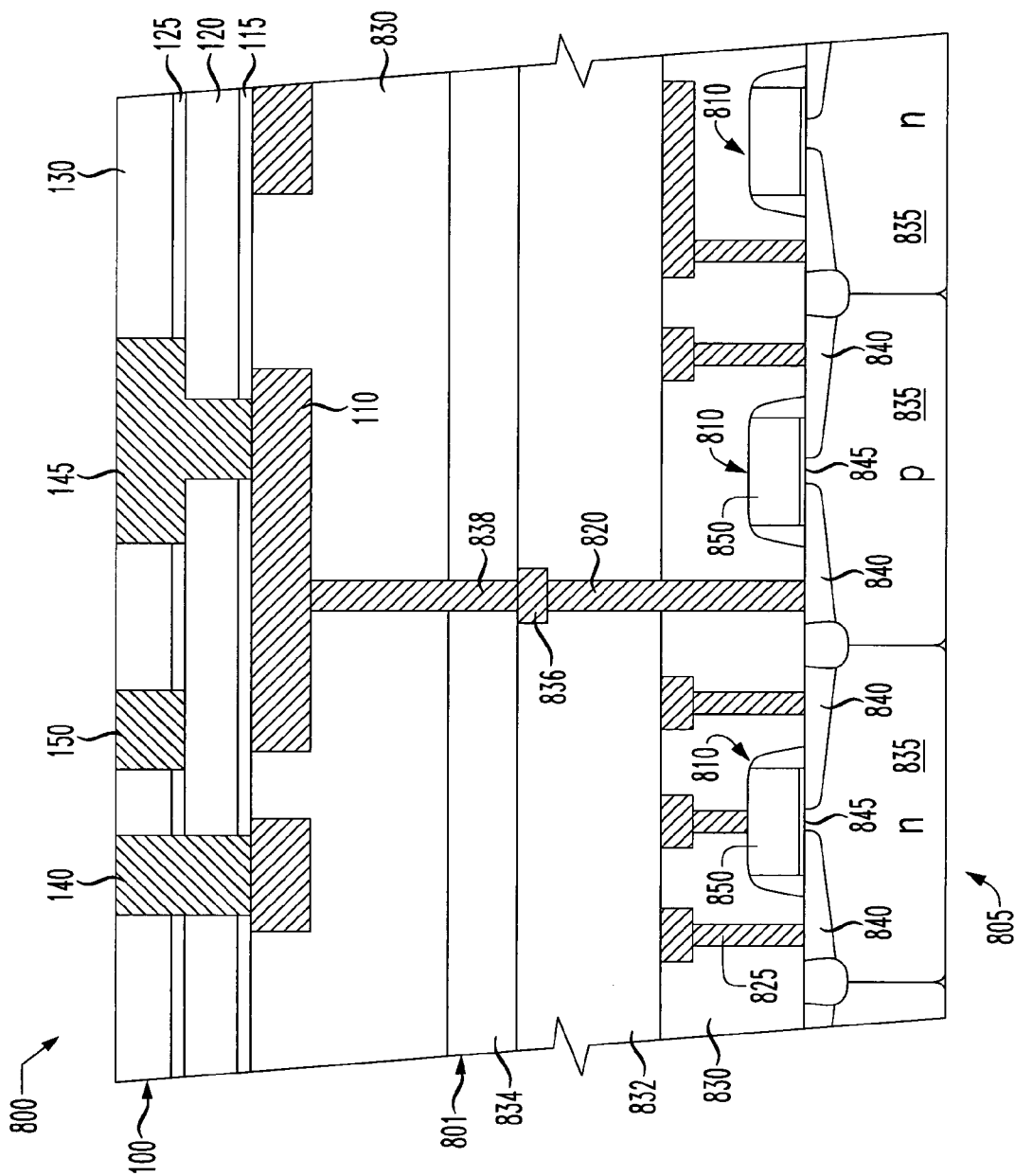
FIG. 4 illustrates a partial sectional view of an interconnect structure showing deposition and patterning of another photoresist layer to the interconnect structure of FIG. 3.

Turning now to FIG. 4, illustrated is a partial sectional view of an interconnect structure 400 showing deposition and patterning of another photoresist layer to the interconnect structure 300 of FIG. 3. A photoresist layer 410 is conventionally deposited and patterned for first and second trench openings 450, 445. In the illustrated embodiment, forming the first trench opening 450 includes first depositing the photoresist 410 over the second dielectric layer 130 and into the first via opening 315. Openings in the photoresist 410 are then formed for the first trench opening 450 and the second trench opening 445 over the second via opening 320. If the photoresist 410 is also initially deposited into the second via opening 320, it is typically removed when patterning the photoresist for the trench openings 445, 450, at this level. The second via opening 320, in advantageous embodiments, will ultimately become an interconnect structure formed by a dual damascene process. The present invention is, therefore, particularly advantageous when conducted with damascene processes, however, it is not limited to such applications. Typically at this point, conventional processes would pattern both the passing metal runner trench openings or landing pads at the same time using a biased reticle to achieve the desired degree of exposure for both the passing metal openings and the trench. However, in the present invention, only the trench runner openings 450, 445, are patterned at this time.

Figure 5:
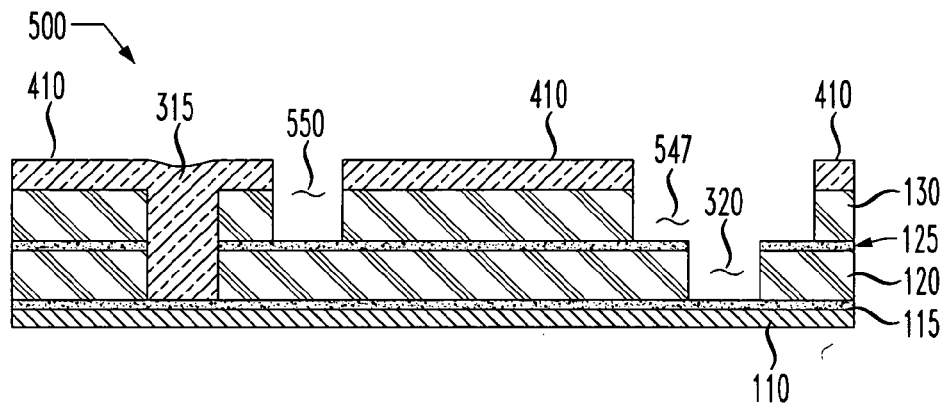
FIG. 5 illustrates a partial sectional view of an interconnect structure showing a dielectric etch that forms the trench openings to the interconnect structure of FIG. 4.

Turning now to FIG. 5, illustrated is a partial sectional view of an interconnect structure 500 showing a dielectric etch that forms trench openings 550, 547 to the interconnect structure 400 of FIG. 4. The first trench opening 550 is formed adjacent the first via opening 315 through the second dielectric layer 130 and to the second etch stop layer 125. The second trench opening 547 is also formed through the second dielectric layer 130 and to the second etch stop layer 125. Again, since the first via opening 315 was formed prior to the first trench opening 550, the overexposure or underexposure issue associated with prior art processes are avoided, thereby maximizing the use of space on any given chip. Additionally, it should also be noted that the first via 315 is protected by the photoresist so that contact with conductive layer 110 is avoided while the trench 550 is etched.

Figure 6:
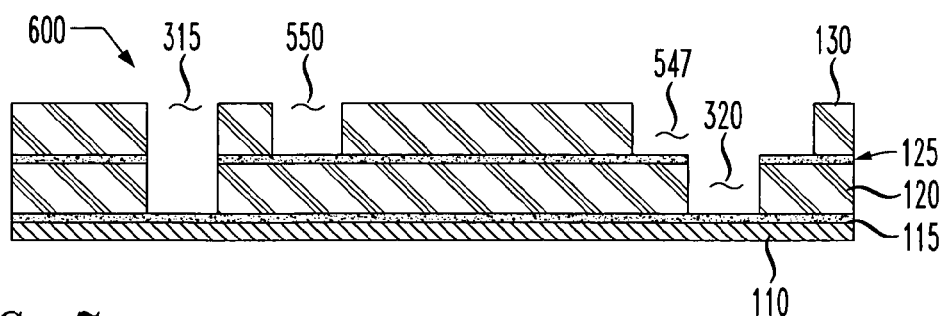
FIG. 6 illustrates a partial sectional view of an interconnect structure showing removal of the photoresist from the interconnect structure of FIG. 5.

Following the formation of the first trench opening 550 and the second trench 547, the photoresist 410 is conventionally removed and the openings 315, 550, 547 and 320 are cleaned, resulting in the structure shown in FIG. 6.

Figure 7:
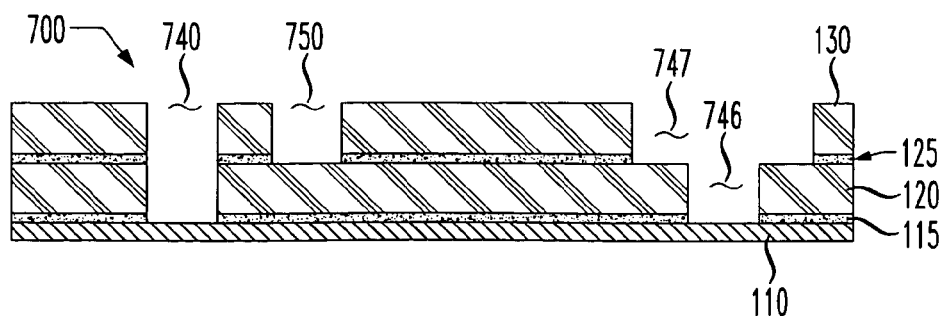
FIG. 7 illustrate a partial sectional view of an interconnect structure showing an etch of the first and second etch stop layers for the interconnect structure of FIG. 6.

Turning now to FIG. 7, illustrated is a partial sectional view of an interconnect structure 700 showing an etch of the first and second etch stop layers for the interconnect structure 600 of FIG. 6 to form first and second via openings 740, 746 and first and second trench openings 750, 747. The first and second via openings 740, 746 are conventionally etched through the first etch stop layer 115 to the conductive layer 110 such that these openings contact the underlying conductive layer 110. Additionally, in an alternative embodiment, the first and second trench openings may be etched through the second etch stop layer 125 to the first dielectric layer 120. Once the various openings are formed, the conductive material, such as copper, may be deposited within the openings to form the interconnect structure 100 of FIG. 1. Preferably, the conductive material is then planarized back to the second dielectric layer 130 to form the interconnect structure 100 as shown in FIG. 1.

In summary, the embodiments of the present invention illustrated in FIGS. 1–7 advantageously provide a situation where the full via opening is etched before the formation of the trench, thereby not requiring a landing pad trench to be formed, which in turn, avoids the photolithographic problems associated with the prior art methods. In fact, the design rules that require the trench to be a certain distance from the via can decrease, because the overexposure and underexposure problems may be substantially reduced, if not eliminated entirely.

Figure 8:
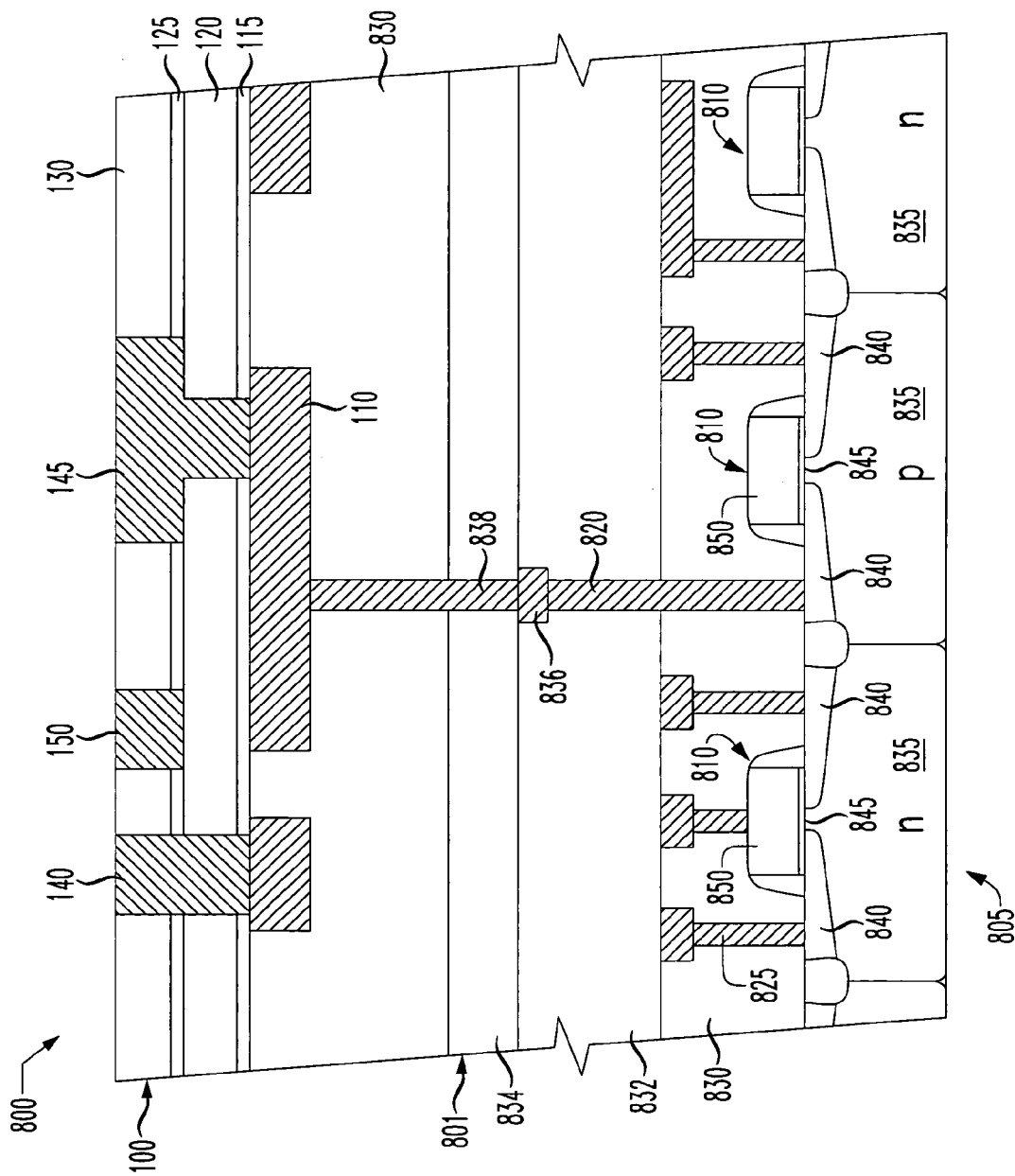
FIG. 8 illustrates a partial sectional view of a combined interconnect structure incorporating an embodiment of the interconnect structure as shown in FIG. 1, and a conventionally formed integrated circuit (IC) that may be used in conjunction with the present invention.

FIG. 8 illustrates a partial sectional view of a combined interconnect structure 800 incorporating an embodiment of the interconnect structure 100 as shown in FIG. 1 and discussed above, and a conventionally formed integrated circuit (IC) 801 that may be used in conjunction with the present invention. While FIG. 8 does not specifically illustrate how the interconnect structure described in FIGS. 1–7 is electrically connected to the IC 801, one who is skilled in the art understands how to make such a connection, and integrate the interconnect structure, as provided herein, into the IC 801. The IC 801 includes conventional transistors 810 that are connected by a via 820, as covered by the present invention or by more conventional interconnects 825, such as damascene structures. The via 820 shows an illustrative embodiment of the present invention. As shown, the via 820 extends through dielectric layers 830 and 832 without a landing pad being present at the interface 833. Thus no landing pad is present in or on the upper surface of dielectric layer 830. However, a landing pad 836 may be located on or in the upper surface of dielectric layer 832 such that a via 838 formed within dielectric layer 834 may be more easily connected to the via 820. Dielectric layers 830, 832, 834 isolate the various layers of the IC 801. As illustrated, the transistors 810 are located on a semiconductor wafer substrate (generally designated 805), and the via 820, which is located within the dielectric layers 830 832 connect the transistors 810 to different layers within the IC circuit 800.

Being of conventional design, forming the transistors 810 may include forming semiconductor devices, such as a complementary metal oxide semiconductor device, a merged bipolar and complementary metal oxide semiconductor device, or a bipolar semiconductor device. In the illustrated embodiment, the transistors 810 include conventionally formed tubs 835, source/drains 840, gate oxides 845 and gates 850. One who is skilled in the art knows how to fabricate the transistors 810 interconnects or vias 825 and dielectric layers 830, 832 and 834. Furthermore, it is also understood that multiple transistors 810, vias 820 and dielectric layers 830, 832, and 834, are typically interconnected to form the IC 801.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   a first metal feature located on a semiconductor surface;
   a first etch stop layer located on the first metal feature;
   a first interlevel dielectric layer located on the first etch stop layer;
   a second etch stop layer located on the first interlevel dielectric layer;
   a second interlevel dielectric layer located on the second etch stop layer;
   an unsegmented via located through the first and second etch stop layers and interlevel dielectric layers, the unsegmented via extending to and contacting the first metal feature and being void of a landing pad between the first and second interlevel dielectric layers;
   a second metal feature located adjacent the unsegmented via and extending through the second interlevel dielectric layer and the second etch stop layer and terminating at the first interlevel dielectric layer; and
   a dual damascene structure adjacent the second metal feature and having a damascene trench portion extending through the second interlevel dielectric layer and the second etch stop layer and terminating at the first interlevel dielectric layer and further including a damascene via portion extending through the first interlevel dielectric layer and the first etch stop layer and connecting the trench portion to the first metal feature.

2. The semiconductor device as recited in claim 1 wherein the unsegmented via is a passing metal via with no passing metal feature.

* * * * *